United States Patent [19]

Takahashi et al.

[11] Patent Number: 5,120,417

[45] Date of Patent: Jun. 9, 1992

[54] MAGNETRON SPUTTERING APPARATUS AND THIN FILM DEPOSITING METHOD

[75] Inventors: Nobuyuki Takahashi; Haruyuki Kochi; Hideaki Yoshida, all of Fuchu; Yasuhiko Akao, Yokohama, all of Japan

[73] Assignee: Anelva Corporation, Tokyo, Japan

[21] Appl. No.: 661,536

[22] Filed: Feb. 27, 1991

[30] Foreign Application Priority Data

Feb. 28, 1990 [JP] Japan .................................. 2-48404
Apr. 10, 1990 [JP] Japan .................................. 2-94750

[51] Int. Cl.⁵ .............................................. C23C 14/35
[52] U.S. Cl. ............................. 204/192.12; 204/298.2
[58] Field of Search ...................... 204/192.12, 298.2

[56] References Cited

FOREIGN PATENT DOCUMENTS

| | | | |
|---|---|---|---|
| 61-291971 | 12/1986 | Japan | 204/298.2 |
| 62-72121 | 4/1987 | Japan | 204/298.2 |
| 62-89864 | 4/1987 | Japan | 204/298.2 |
| 63-282263 | 11/1988 | Japan | 204/298.2 |
| 63-290275 | 11/1988 | Japan | 204/298.2 |
| 2-34780 | 2/1990 | Japan | 204/298.2 |

*Primary Examiner*—Aaron Weisstuch
*Attorney, Agent, or Firm*—Wenderoth, Lind & Ponack

[57] ABSTRACT

A magnetron cathode sputtering apparatus for providing an increased strength of the rotating magnetic field around the center area of a target when the sputtering occurs at the target, thereby reducing any dust particles that might settle on the center target area and might travel toward a wafer or each individual substrate thereon to form or deposit a thin film containing defects such as pin holes on the wafer. A magnetron cathode sputtering method uses such apparatus to form or deposit a thin film layer on the wafer, with its distribution within ±5% of the calculated value, and provides an improved step coverage for contact holes formed in each individual substrate of the wafer, from which irregularities can be substantially eliminated.

6 Claims, 11 Drawing Sheets

MAGNETRON SPUTTERING APPARATUS AND THIN FILM DEPOSITING METHOD

BACKGROUND OF INVENTION

1. Field of the Invention

The present invention relates to a magnetron sputtering apparatus which may be used for depositing or forming a thin film on a wafer or each individual substrate thereon in order to fabricate semiconductor devices or electronic components, such as a magnetic disc, optical disc, or magnetic optical disc. It also relates to a method of depositing or forming a thin film on the wafer or each individual substrate thereon by making use of such a magnetron sputtering apparatus.

2. Description of the Prior Art

A typical magnetron sputtering apparatus that is known in the relevant prior art has been used widely, because of its simple construction, high productivity, and good reproducibility.

Specifically, a type of magnetron sputtering apparatus that is designed for fabricating semiconductor devices by a single wafer process has the following advantages:

(1) It can increase the rate at which a thin film or layer is deposited or formed on the wafer, and can minimize the effects of any gaseous impurities that may be produced during that process. This provides good quality thin films on the wafer; and (2) It allows a thin film to be formed within the wafer or each individual substrate on the wafer in a controlled manner, and provides an identical profile, or geometrical configuration, for the thin film formed within every individual substrate or wafer.

Figure 14:
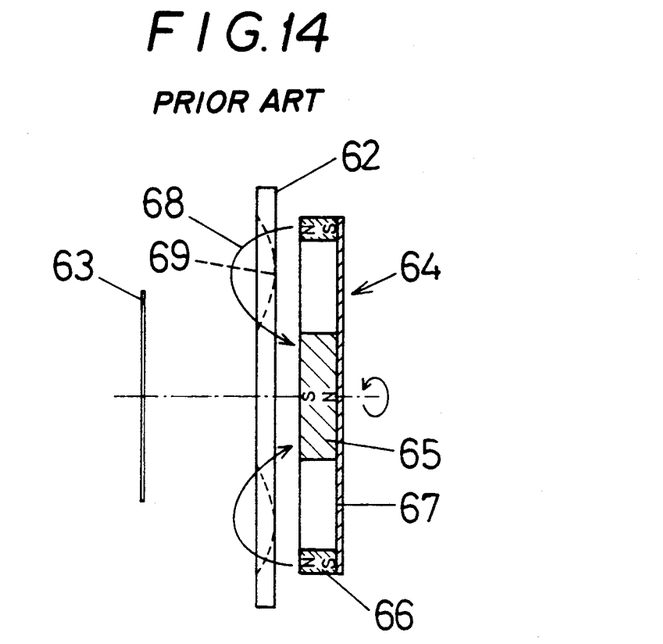
FIG. 14 is a sectional view showing the principal components of the prior art apparatus.
Figure 15:
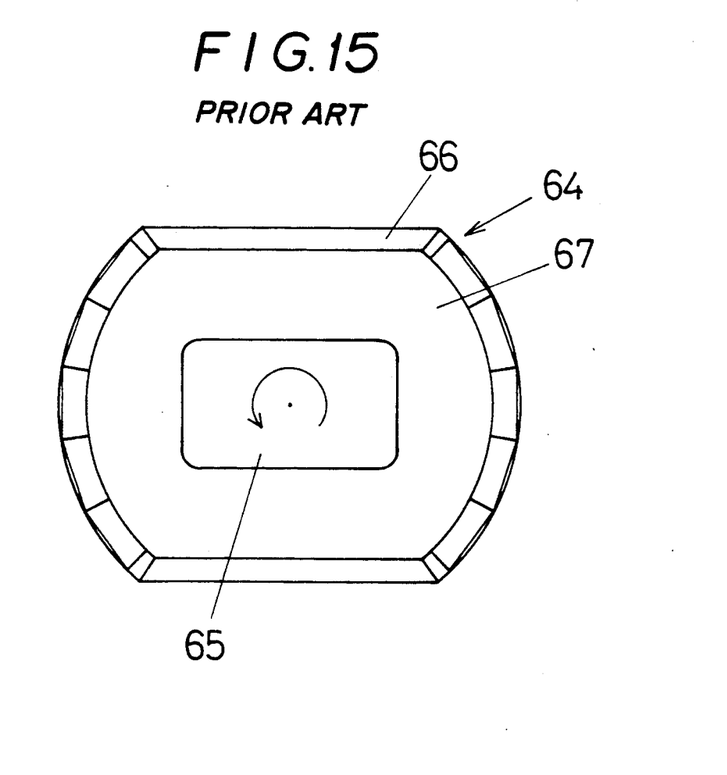
FIG. 15 is a front view showing the means for developing the magnetic field in the prior art apparatus of FIG. 14.

FIGS. 14 and 15 show a typical prior art magnetron sputtering apparatus that has been used heretofore for the above particular purposes, which comprises a magnetron cathode including a circular target material 62, and a wafer 63 which contains individual substrates thereon. The substrates are placed with a specific spacing therebetween, with one facing opposite the other. The magnetron cathode also includes means 64 for producing a magnetic field, which means is placed behind the circular target material 62 and the wafer 63. This discharge provides the sputtering action upon the circular target material, so that a thin film can be formed or deposited on the wafer or each individual substrate thereon.

The magnetic field producing means 64 includes a center magnet 65 and an annular magnet 66 surrounding the outer circumferential edge of the center magnet 65, the other two magnets being connected by a yoke 67. The assembly 64 provides lines of magnetic force as shown by 68 which develop a magnetic field across the circular target 62. The circular target material undergoes the sputtering action which produces an annular erosion region 69 as shown by the dotted lines on the surface of the target 62. This annular erosion region 69 is caused by the rotation of the magnetic field producing assembly 64.

Figure 16:
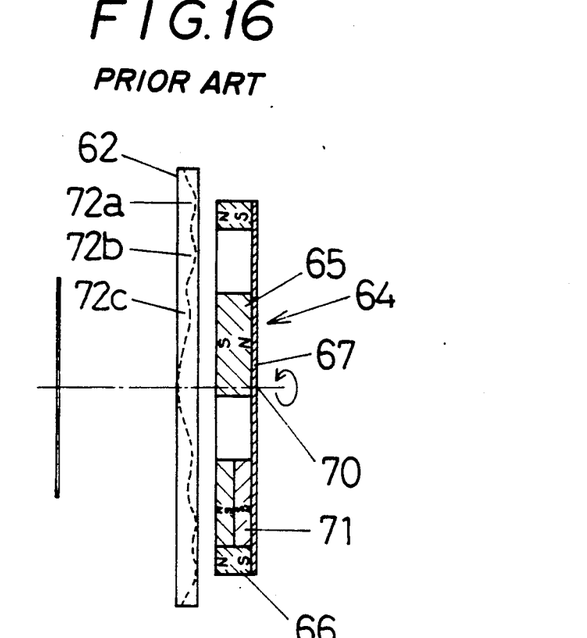
FIG. 16 is a sectional view showing the principal components of another prior art apparatus.
Figure 17:
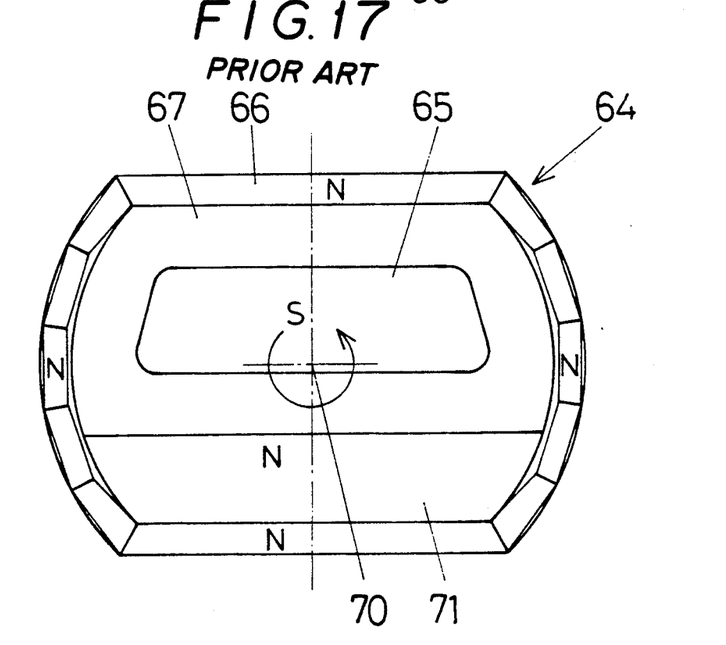
FIG. 17 is a front view showing the means for developing the magnetic field in the prior art apparatus of FIG. 16.

FIGS. 16 and 17 show another prior art magnetron sputtering apparatus which also has been used in past years. This apparatus is an improvement over the apparatus shown in FIGS. 14 and 15. In the apparatus shown in FIGS. 16 and 17, the magnetic field producing assembly 64 which is placed behind the circular target 62 has a construction that is different from that of the assembly 64 in the earlier described apparatus. Specifically, the magnetic field producing assembly 64 includes an annular magnet 66 which is disposed around the circumference of a yoke 67, and a central magnet 65 which is offset from the center axis of rotation 70 as shown in FIG. 17. On the side of the axis 70 opposite the side on which central magnet 65 is located, there are two auxiliary magnets 71 which are placed one on top of the other inside the annular magnet 66.

The prior art magnetron sputtering apparatus shown in FIGS. 16 and 17 has the following constructional features that distinguish it from the prior art apparatus shown in FIGS. 14 and 15. As shown in FIGS. 16 and 17, the central magnet 65, which is formed like a plate having a rectangular shape, is offset from the center axis of rotation 70 of the magnetic field producing assembly 64 to one side thereof, and the auxiliary plate magnets 71 (which are rubber sheets containing impregnated ferrite and which are placed one on top of another) are disposed inside the annular magnet 66. The number of auxiliary plate magnets 71, as well as the direction of the magnetic field developed by each of the sheets, may be changed. The erosion region (the portion of the target material that is eroded by sputtering) that appears on the surface of the circular target 62 consists of triple concentric circles 72a, 72b and 72c, as shown by the dotted lines in FIG. 16. This makes it possible to make more effective use of the target material, the utilization of which may amount to about 58%.

As described, the apparatus shown in FIGS. 16 and 17 provides an improvement over the apparatus shown in FIGS. 14 and 15, in that the target material can be utilized more effectively. Also, it can improve the step coverage of the surfaces of contact holes formed in, and the distribution of thin films formed on, the wafer or all individual substrates thereon, as compared with the apparatus in FIGS. 14 and 15. However, the problems of dust particles that may originate in the target material and may be transported across the spaces between the target and onto the wafer, eventually settling on the wafer or individual substrates thereon, remains unsolved.

It should also be noted that, in the use of the improved apparatus shown in FIGS. 16 and 17, the sputtering cannot take place from all the areas of the circular target material, with some areas of the target located around its center being subject to little or no sputtering action. It is noted that dust particles tend to settle on these areas, adhesively or not. The dust particles are thus easily transported from these areas toward the wafer or individual substrates thereon, during the sputtering process. When these dust particles settle on the thin films formed on some substrates on the wafer, they may affect the quality of those particular substrates, which may contain defects such as pin holes.

Another problem occurs with the contact holes formed in the wafer or each individual substrate thereon during the sputtering process. With the apparatus shown in FIGS. 16 and 17, it is difficult to provide a uniform thin film coating on all surfaces of the formed contact holes. The films on the contact holes, which are located at various points on the wafer, may become irregular. A further problem is the irregular thin film coating at each individual contact hole.

SUMMARY OF THE INVENTION

It may be appreciated from the preceding description that the apparatus shown in FIGS. 16 and 17 may provide some degree of improvement over the apparatus shown in FIGS. 14 and 15, in respect to the above problems, but it is recognized that the apparatus must be improved further to meet the recent requirements for higher density and integration of semiconductor devices.

In light of the problems that have been described so far, it is accordingly the object of the present invention to provide a magnetron sputtering apparatus that provides further improvement in the sputtering capabilities so that they can sputter all areas of the target material, including the center areas in particular, and can minimize the chances of any dust particles settling, adhesively or not, on some particular areas, such as the center areas of the target.

Another object of the present invention is to provide a method of forming or depositing a thin film on a wafer or each individual substrate thereon by using the above-described magnetron sputtering apparatus, whereby a uniform or regular step film coverage can be provided for the contact holes formed at various locations in the wafer, and the thin film coating formed or deposited can be distributed uniformly and evenly over the whole wafer or each individual substrate thereon.

The present invention essentially provides means for increasing the strength of the magnetic field around the center area of a target material being subjected to the sputtering action, thereby ensuring that the center area material can also be subjected to sputtering action.

In its specific form, the magnetron sputtering apparatus according to the present invention includes a magnetic field producing assembly which is rotatably mounted for rotation around an axis of rotation, including a center magnet disposed behind a circular target material and an annular magnet disposed around the outer circumferential edge of the center magnet, the center magnet and annular magnet being mounted on a yoke so as to be magnetically coupled, and further includes auxiliary magnets that supplement the center magnet and annular magnet for enhancing the strength of the magnetic field in the center areas of the circular target.

The method according to the present invention consists of forming or depositing a thin film on a wafer or each individual substrate thereon by making use of the magnetron sputtering apparatus. The erosion pattern of the circular target has a profile or geometric configuration containing a double circle. The two circles are formed concentrically around a common axis, each having its respective peak point between 15/152b to 20/152b and between 50/152b to 60/152b (where "b" is the diameter of the circular target). The inner circle and outer circle have an erosion strength ratio of between 2:3 and 1:1 at their respective peak points.

The magnetron sputtering apparatus according to the present invention provides a strength of the magnetic field around the center areas of the circular target that is sufficient to confine the plasma developed between the target and wafer during the sputtering process within the center target areas, thereby increasing the concentration of the plasma on the center target areas. In this way, the center target areas can undergo better sputtering and yet the remaining areas of the target can be fully sputtered. The result is the coverage of all target areas. This prevents any dust particles from settling on the target material, thereby reducing or minimizing the quantity of dust particles that will be transported from the target onto the wafer or individual substrates thereon.

According to the method of the invention, a thin film layer distribution can be caused to extend into the depth of the wafer or individual substrates thereon within a limit of ±5%. The step coverage for the contact holes formed in the wafer or individual substrates thereon can be regular, and any irregularities that may occur in the contact holes can be reduced.

BRIEF DESCRIPTION OF THE DRAWINGS

These and other objects, features and merits of the present invention will become apparent from the remainder of the specification in which several preferred embodiments will be fully described with reference to the accompanying drawings, in which.

DESCRIPTION OF THE PREFERRED EMBODIMENTS

Figure 1:
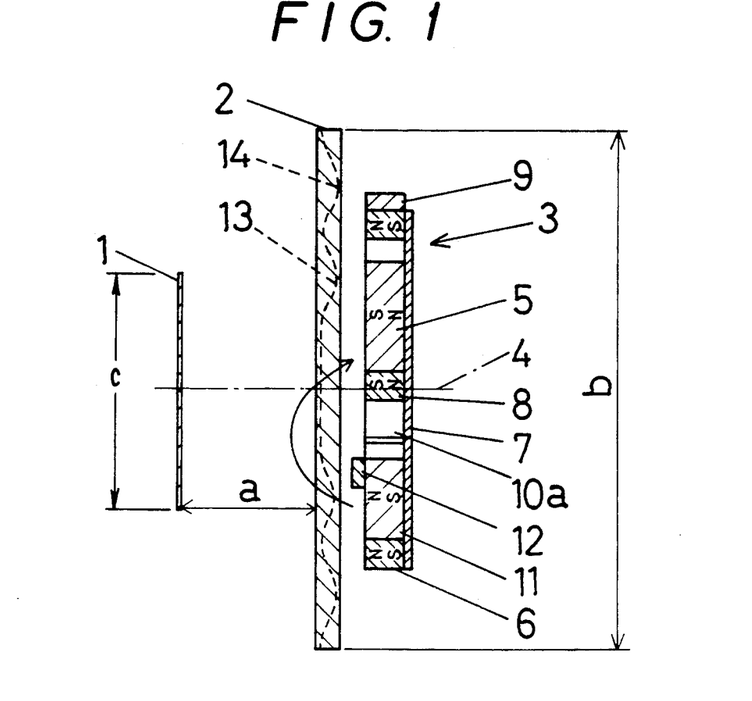
FIG. 1 is a transverse section view showing the principal components of the magnetron sputtering apparatus according to a preferred embodiment of the present invention.
Figure 2:
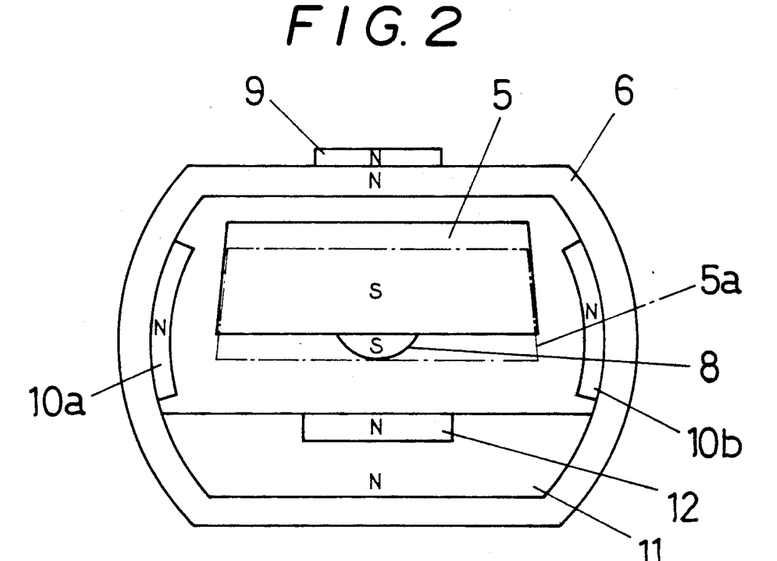
FIG. 2 is a front view of the means for developing a magnetic field forming part of the embodiment of FIG. 1.
Figure 3:
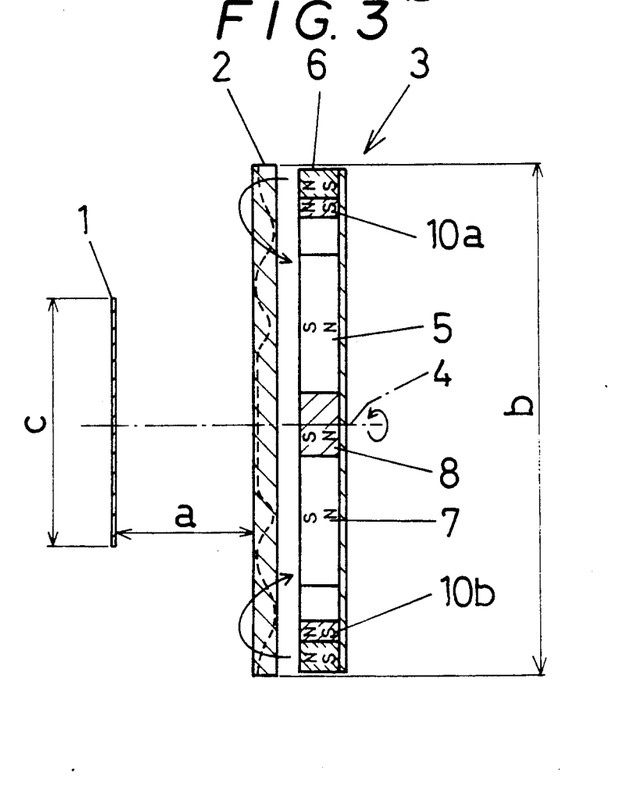
FIG. 3 is a longitudinal section view showing the principal components of the embodiment of FIG. 1.

Referring first to FIGS. 1-3, the magnetron sputtering apparatus according to the particular preferred embodiment of the present invention will be described in further detail.

The apparatus is for processing a wafer 1 by sputtering, and includes a circular target 2, a means 3 for producing a magnetic field, all of which are positioned relative to each other in the same manner as in the prior art apparatus. The wafer 1 and the circular target 2 are placed in parallel, with the one facing the other, and the magnetic field producing means 3 is placed behind the circular target 2 relative to the wafer. The means 3 is capable of rotating on its center axis 4.

The magnetic field producing means 3 consists essentially of a center magnet 5 for providing a south (S) polarity pole facing the target 2, and an annular magnet 6 oriented for providing a north (N) polarity pole facing the target and which surrounds the center magnet 5. The magnets 5 and 6 are coupled together by the yoke 7 on the rear side thereof. In the prior art apparatus (FIGS. 16 and 17), the central magnet 5 is placed as indicated by the dot-dash lines 5a in FIG. 2. In the embodiment of the present invention, the center magnet 5 is offset outwardly of such position in a radial direction from the axis 4 by about 15 mm and an auxiliary magnet 8 having a hemicylindrical shape is positioned inwardly of the center magnet 5, i.e. closer to the center axis with a south (S) pole facing the target.

The annular magnet 6 also includes an auxiliary magnet 9 which has a plate shape and is placed on the outer circumferential edge of the annular magnet on one side thereof and which has a north (N) pole facing the target, and two further auxiliary magnets 10a and 10b which have a plate shape and which are placed on the opposite sides of the inner circumference of the annular magnet 6 and which have a north (N) pole facing the target. An additional auxiliary magnet 11, which has a plate shape and is functionally equivalent to the auxiliary magnet 71 in the prior art apparatus, is provided on the inner circumference of the annular magnet 6 on the opposite side of axis 4 from the center magnet 5, and which has a north (N) pole facing the target. A further additional auxiliary magnet 12 is provided on the inner edge of the auxiliary magnet 11 with a north (N) pole facing the target.

Figure 2A:
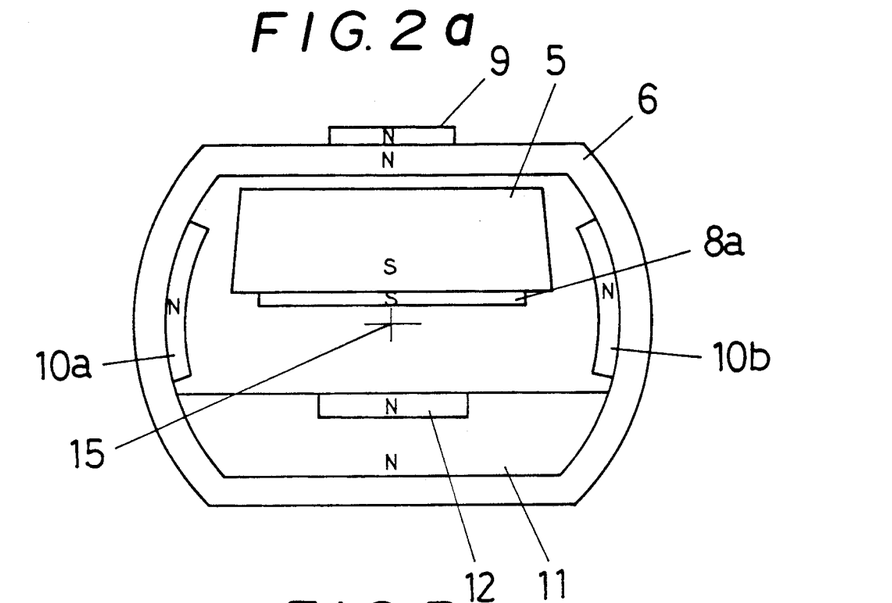
FIG. 2a is a front view of means for developing a magnetic field according to another embodiment of the present invention.

The auxiliary magnet 8 may be replaced by a plate-shaped auxiliary magnet 8a, as shown in FIG. 2a, and it may be placed so that it is offset from the center axis 15 of rotation of the magnet field producing assembly 3 of FIG. 2a.

Figure 4:
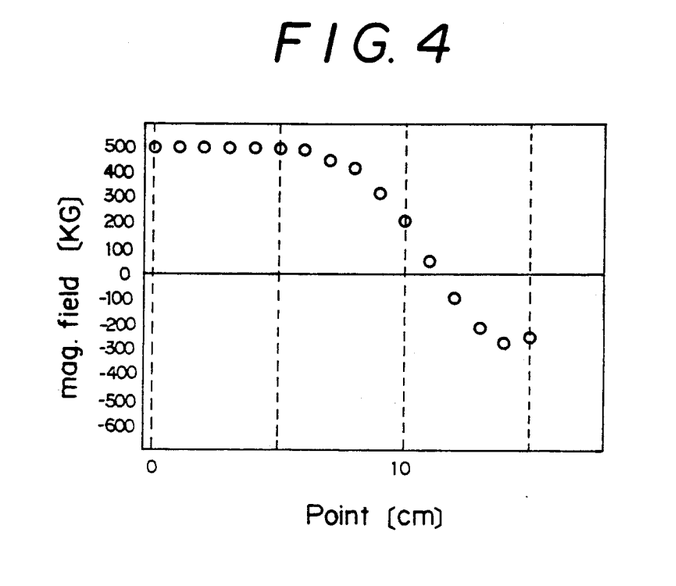
FIG. 4 is a diagram that shows the magnetic field distribution over a target in the embodiment of FIG. 1.
Figure 5:
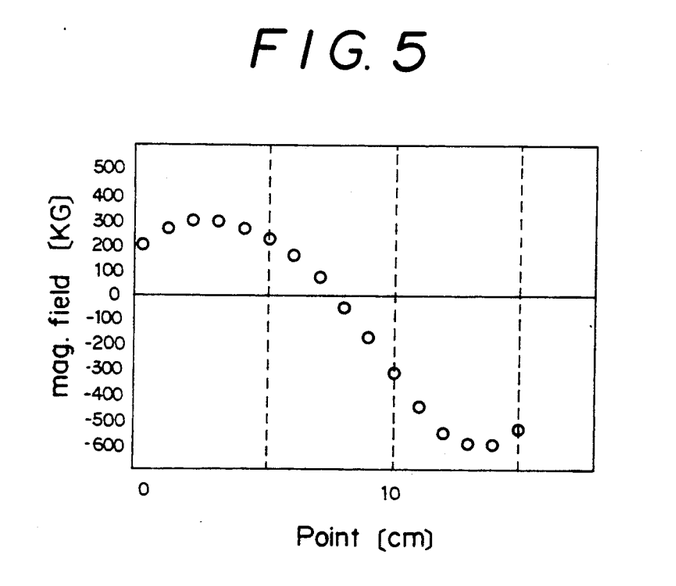
FIG. 5 is a diagram that shows the magnetic field distribution over a target in a prior art apparatus (such as the one shown in FIGS. 16 and 17)

In the embodiment described above, the vertical magnetic field on the surface of the circular target 2 will have a distribution as shown in FIG. 4 as measured upwardly, beginning from the center axis 4 in FIG. 1. It will be appreciated from this magnetic field distribution that the magnetic field is stronger around the center area of the circular target, and is more extensive than in the magnetic field distribution of the prior art apparatus as in FIG. 5. This results from the fact that the center magnet 5 is offset from the center axis more than in the prior art apparatus and the auxiliary magnet 8 is provided.

The magnetic field around the center areas of the target is strong enough to confine the plasma developed between the wafer 1 and circular target 2 during the sputtering process, thereby allowing the center areas of the circular target to be subjected to the full sputtering process.

In practice, during the sputtering process, the magnetic field producing assembly 3 rotates at a particular predetermined speed, and the magnetic field being developed in the sputtering space varies constantly as the magnetic field producing assembly 3 is rotating. This produces an erosion pattern in the circular target 2, as shown by the dotted lines in FIGS. 1 and 3. The deepest erosions 13 and 14 appear as double concentric circles. The inner erosion circle 13 is equal to 0.23 times the reference radius of the circular target 2, and the outer erosion circle 14 is equal to 0.76 times the reference radius of the target 2. The percentage of the target material utilized for sputtering amounts to 48% of the total target material. Presumably, the formation of the outer erosion circle 14 is due to the particular arrangement of the magnets 10a and 10b. Similarly, the formation of the inner erosion circle 13 is due to the particular arrangement of the auxiliary magnets 8, 9 and 12. It should be noted, in this case, that the diameter b of the circular target 2 is such that it is equal to double the diameter c of the wafer 1, and the distance or spacing a between the wafer 1 and circular target 2 is chosen such that it is equal to about one-fourth the diameter b.

Figure 6:
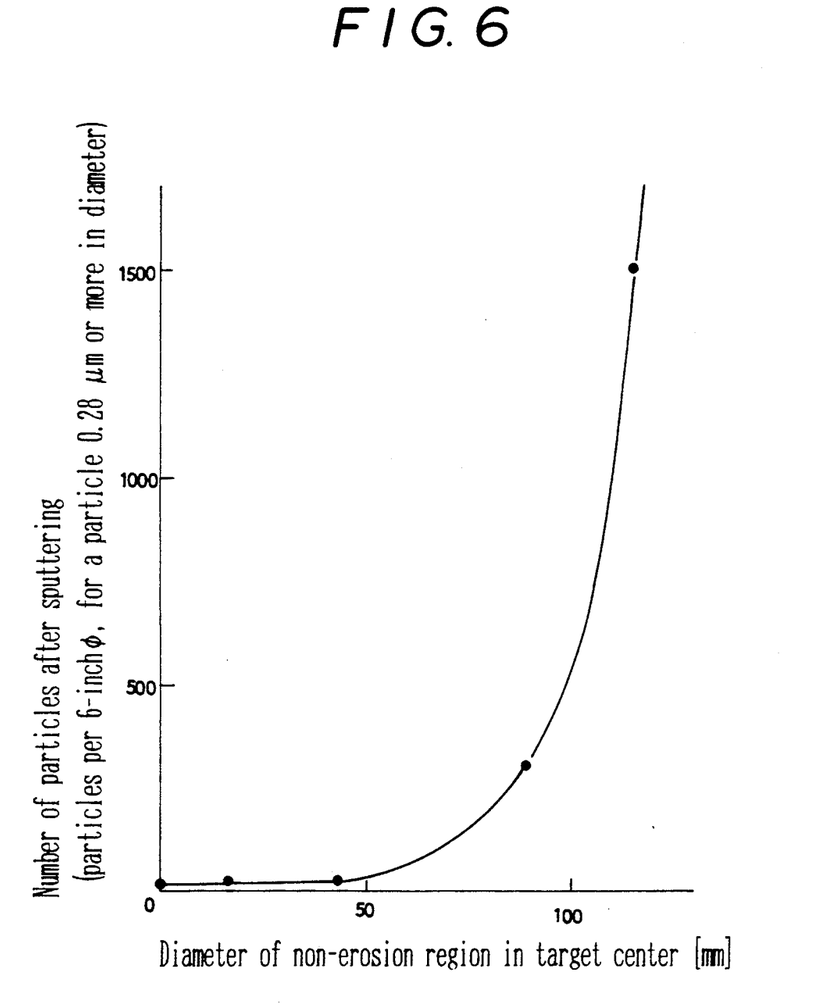
FIG. 6 is a graph for explaining the relationships between the non-erosion region and the number of dust particles on a wafer in the particular embodiment of the present invention.

FIG. 6 shows the relationships between the non-erosion region (the region not affected by the sputtering action) and the number of dust particles that may settle on the circular target 2, when the non-erosion region around the center areas of the circular target 2 is varied by varying the strengths of the auxiliary magnets 8, 9, 10a, 10b, 11 and 12, in accordance with the apparatus in the current embodiment.

The result shows that the number of dust particles will decrease drastically as the non-erosion region is reduced. It will be appreciated that the number of dust particles can be reduced to zero (0) when the whole surface of the target is eroded as described above for the embodiment of the present invention.

The following description provides the specific conditions under which a thin film is formed or deposited on a wafer or individual substrates thereon by using the apparatus according to the above described embodiment. The conditions are those under which the running test takes place and a thin film is formed.

Figure 7:
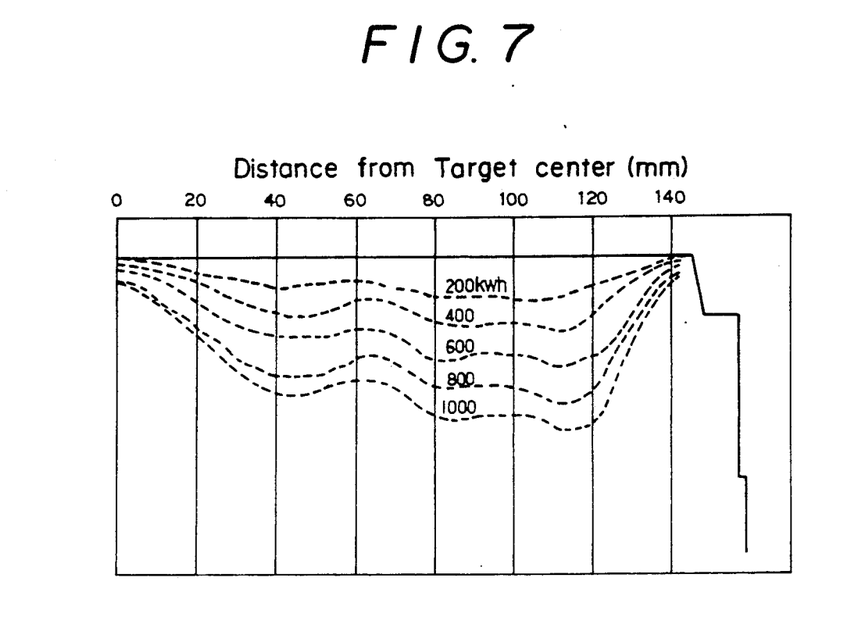
FIG. 7 is a diagram for showing the erosion profile of a target in the prior art apparatus.

Initially, a running test (1,000 Kwh) was conducted using the prior art apparatus shown in FIGS. 16 and 17, during which an erosion profile of the target as shown in FIG. 7 was obtained. In this running test, the target had a diameter of 12", the wafer had a diameter of 6", and the distance between the wafer and target was 65 mm.

The results obtained from the running test were plotted as shown in FIG. 7, from which the depth of erosion at positions successively 20 mm farther away from the target center is shown. Assuming that the depth of erosion at each position is proportional to the strength of particles produced by the sputtering action, and that the sputtered particles from every point of erosion are traveling toward the wafer or each individual substrate thereon according to a cosine law, a calculation can be performed to determine the shape of a layer of thin film being deposited on the wafer.

This calculation assumes that the wafer contains contact holes 1 μm in diameter and 1 μm deep at its center point and at points 40 mm and 80 mm away from the center, respectively.

Figure 8A:
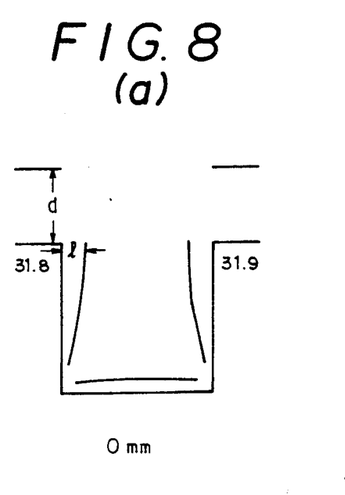
FIGS. 8(a)-8(c) are sectional views showing a contact hole portion as determined by a simulation calculation performed according to FIG. 7.
Figure 8B:
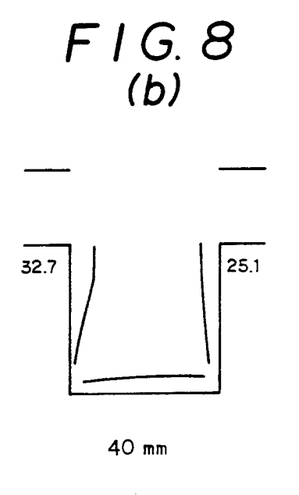
Figure 8C:
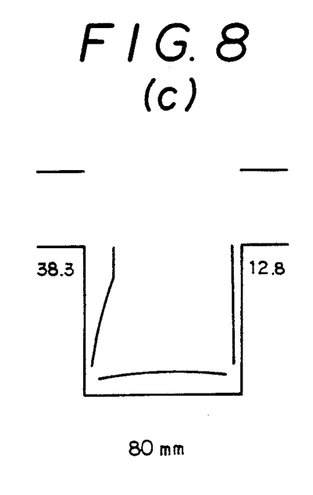
Figure 9A:
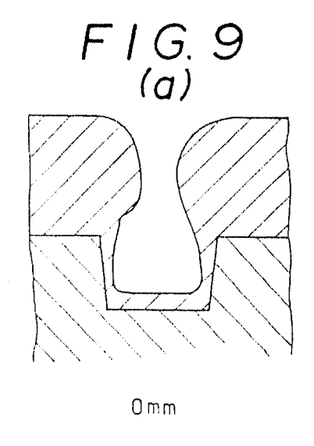
FIGS. 9(a)-9(c) are schematic drawings showing a section through a metal substrate on which a thin film has been deposited by using the prior art apparatus.
Figure 9B:
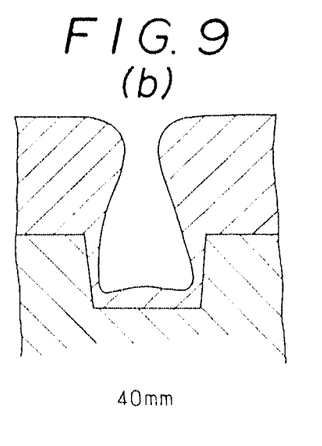
Figure 9C:
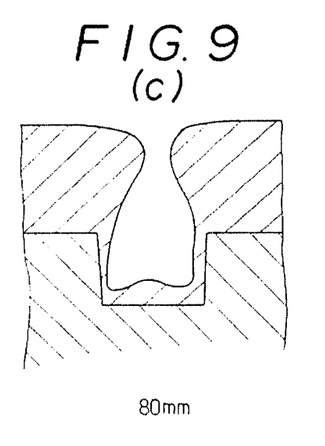
Figure 9D:
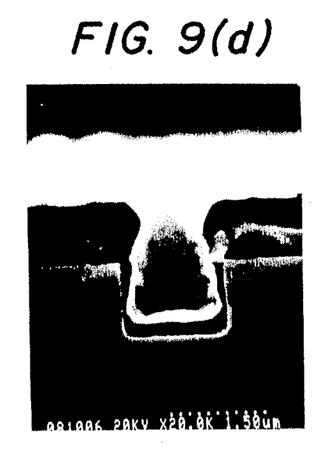
FIGS. 9(d)-(f) are SEM photographs of actual sectioned substrates showing the thin films deposited by using the prior art apparatus.
Figure 9E:
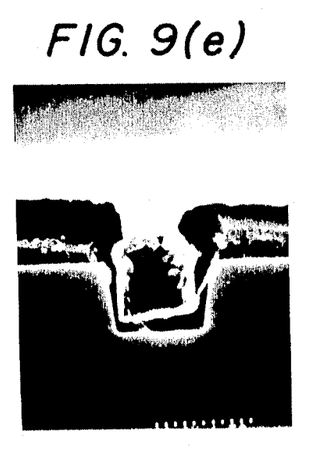
Figure 9F:
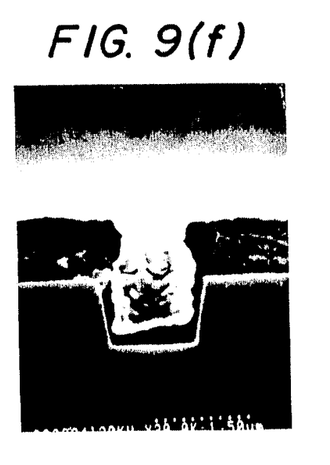

The results obtained from the calculation are shown in FIGS. 8(a)-8(c). In each of FIGS. 9(a), (b) and (c), the actual coatings formed are shown diagrammatically, and the SEM photographs of FIGS. 9(d), (e) and (f) show the thin film coating actually formed on the wafer. FIGS. 9(a) and (d) represent the contact hole located in the target center, FIGS. 9(b) and (e) represent the contact hole located 40 mm away from the target center, and FIGS. 9(c) and (f) represent the contact hole located 80 mm away from the target center.

Figure 11A:
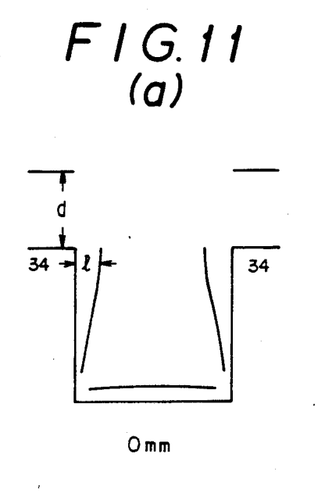
FIGS. 11(a)-11(c) are views similar to FIGS. 8(a)-8(c) but in which the calculation has been performed according to FIG. 10.
Figure 11B:
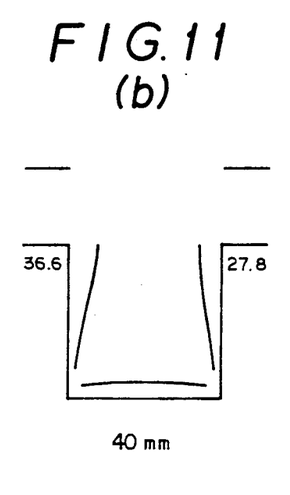
Figure 11C:
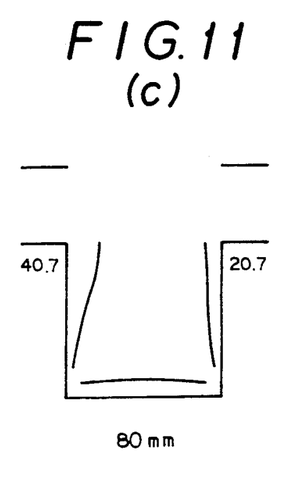

The numbers shown on the opposite sides of the schematically shown holes in FIGS. 8(a)-8(c) represent the characteristics of the step coverage, i.e. the coverage of the step between the wafer surface and the side walls of the hole, respectively. Those figures show the values of 1 for d=100, where "d" refers to the thickness of the thin film deposited on the wafer, and "l" refers to the thickness of the thin film deposited on the upper end of the side wall of the contact hole. In FIG. 8(a), for example, the thickness of the film on the left side wall has the value of l=31.8 for d=100. In FIGS. 11(a)-11(c), similar numbers are given in the same manner as in FIG. 8, as will be described later.

FIGS. 8(a)-8(c) and FIGS. 9(a)-9(f) show that the results obtained from the simulation calculation agree well with the results obtained from the production test.

A running test was also carried out using the magnetron cathode described in the embodiment shown in FIGS. 1-3.

Figure 10:
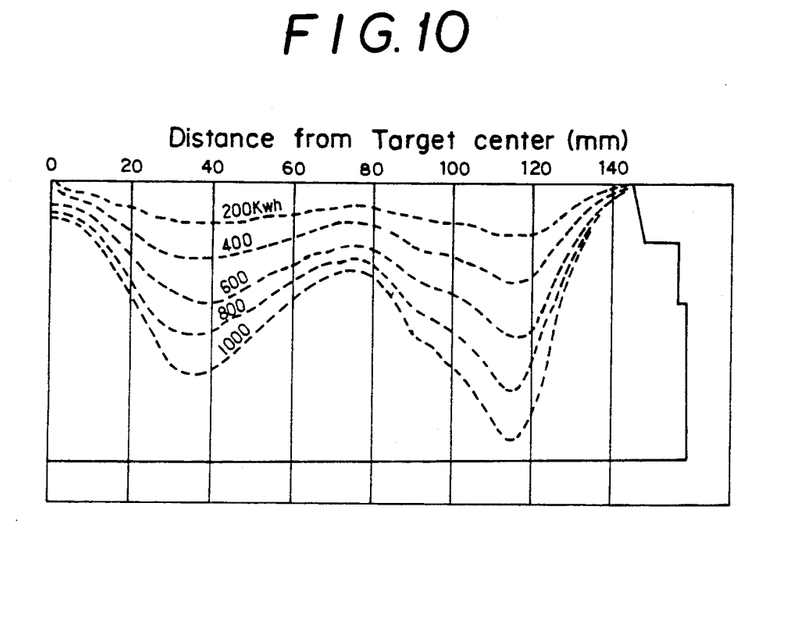
FIG. 10 is a diagram for showing the erosion profile of a target in the embodiment of FIGS. 1-3.
Figure 12A:
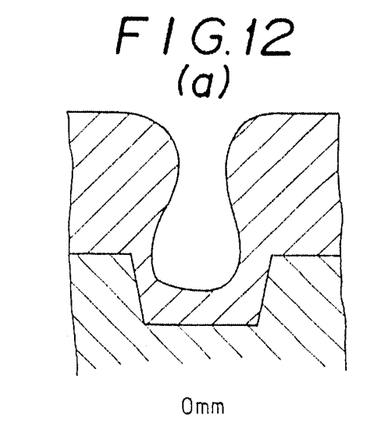
FIGS. 12(a)-12(c) are schematic drawings showing a section through a metal substrate on which a thin film has been deposited by using the apparatus of the present invention.
Figure 12B:
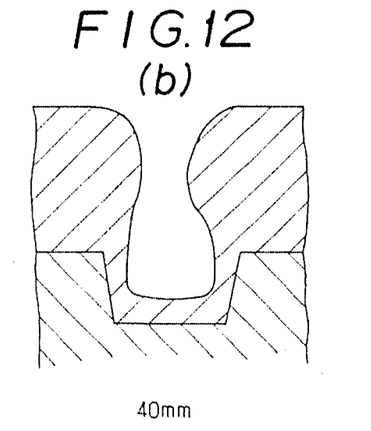
Figure 12C:
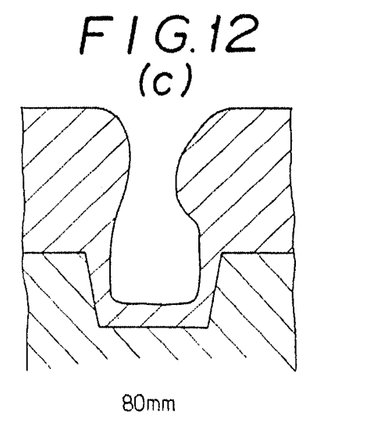
Figure 12D:
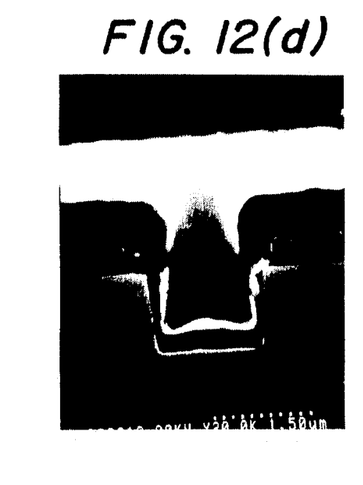
FIGS. 12(d)-12(f) are SEM photographs of actual sectioned substrates showing the thin film deposited by using the apparatus of the present invention.
Figure 12E:
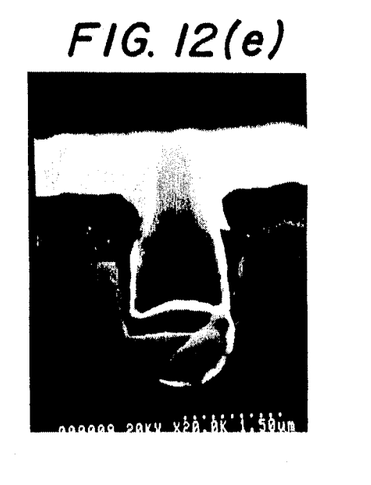
Figure 12F:
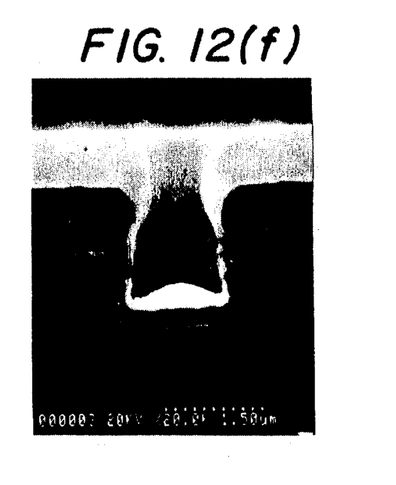

The erosion profile obtained from this running test (1,000 Kwh) is shown in FIG. 10. From this erosion profile, the simulation calculation was performed in the same way as described above to produce the configurations of the thin film deposits obtained from the erosion profile, and these are shown in FIGS. 11(a)-11(c). The SEM photographs and the corresponding schematic cross-sectional views for the contact holes with the films from the actual production test are shown in FIGS. 12(d)-12(f) and in FIGS. 12(a)-12(c), respectively. As seen from FIGS. 11(a)-11(c) and FIGS. 12(a)-12(f), the results from the simulation calculation agree well with those from the production test.

The values for the step coverage given for each contact hole in FIGS. 8(a)-8(c) and FIGS. 11(a)-11(c) show that the apparatus of FIGS. 1-3 can eliminate the irregularities in the step coverage.

Figure 13:
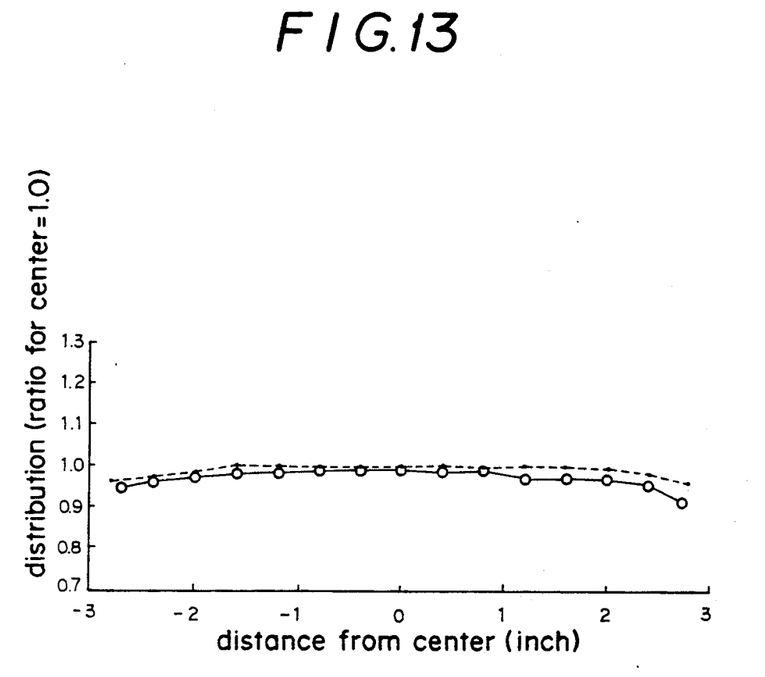
FIG. 13 is a graph showing the distribution of the thin film deposited by using the apparatus of the invention.

FIG. 13 shows the thin film distribution which is obtained by using the magnetron cathode shown in FIGS. 1-3. In FIG. 13, the solid lines indicate the test results, and the dotted lines indicate the results from the simulation calculation. Those results show the thin film distribution to be within ±5% of the average thickness of the thin film.

It can be seen from the above results that the magnetron cathode shown in FIGS. 1-3 can improve the distribution of the thin film to be formed or deposited by sputtering, and can also substantially eliminate irregularities in the step coverage of the contact holes.

The simulation calculation giving the above results define the requirements for the erosion profile that can be provided by the magnetron cathode and which provide a thin film distribution of within ±5% and step coverage of within ±10%. The results obtained from the simulation calculation show that the above requirements can be met when the erosion profile has peak points of 15/152b to 20/152b and 50/152b to 60/152b located away from the target center (where "b" is the diameter of the target), and an inner to outer erosion strength ratio of 2:3 and 1:1, where the erosion strength ratio is the ratio of the depth of the eroded part of the target to the maximum erosion depth of the target.

The spacing "a" between the wafer and target is 12/61b to 15/61b (where "b" is the diameter of the target).

It can be understood from the foregoing description that the magnetron sputtering apparatus according to the present invention can provide an increased magnetic field strength around the center area of the circular target surface, thereby eliminating any dust particles that may settle on the target. Thus, the apparatus can provide the wafer or each individual substrate thereon with the thin films formed or deposited by the sputtering process and containing no defects such as pin holes.

The method of forming or depositing a thin film by using the magnetron sputtering apparatus of the invention causes the atoms emitted from the target material by sputtering to be directed onto the wafer or each individual substrate thereon in a consistent manner. The method also eliminates any irregularities in the coverage for the contact holes that may have a high aspect ratio, and provides a thin film distribution of within ±5% of the average value. Thus, the method may reliably apply to the manufacture of any semiconductor device that must meet the high density and high integration requirements.

Although the present invention has been described with particular reference to the several preferred embodiments thereof, it should be understood that various changes and modifications may be made within the scope and spirit of the invention.

What is claimed is:

1. In a magnetron sputtering apparatus that includes:
a circular target plate;
magnetic field generating means disposed behind the circular target plate and rotatable around a center axis of rotation and including a center magnet and a ring-shaped magnet arranged around the outer circumference of the center magnet, the center magnet and the ring-shaped magnet having respective opposite poles facing toward said target plate;
a yoke connecting said center magnet and ring-shaped magnet; and
means for causing rotation of the magnetic field generating means around said center axis of rotation, the improvement including:
(a) said center magnet being offset laterally toward one side of the center axis of rotation of the magnetic field generating means;
(b) a first auxiliary magnet means having an identical polarity to said center magnet and disposed on the side of said center magnet toward said center axis of rotation;
(c) second auxiliary magnet means having an identical polarity to said ring-shaped magnet and disposed on the outer circumference of said ring-shaped magnet and adjacently to said center magnet on the same side of said center axis of rotation on which said center magnetic is located;
(d) two third auxiliary magnet means each having an identical polarity to said ring-shaped magnet and disposed on the inner circumference of said ring-shaped magnet on the opposite lateral ends thereof perpendicularly to the direction in which said center magnet is offset from said center axis of rotation;

(e) fourth auxiliary magnet means having an identical polarity to said ring-shaped magnet and disposed on the inner circumference of said ring-shaped magnet on the side of said center axis of rotation opposite the side on which said first auxiliary magnet means is located; and (f) fifth auxiliary magnet means having an identical polarity with and integrated with the edge of said fourth auxiliary magnet means which is toward said center axis of rotation;

whereby all of said auxiliary magnet means providing a combined magnetic field strength for the center areas on the circular target plate surface, when the magnetic field generating means is rotated.

2. A magnetron sputtering apparatus as defined in claim 1, wherein said first auxiliary magnet means on said center magnet is located in the position offset from said center axis of rotation of the magnetic field generating means.

3. A magnetron sputtering apparatus as defined in claim 1, wherein said center magnet has a south (S) polarity pole facing said target, and said ring-shaped magnet has a north (N) polarity pole facing said target.

4. A magnetron sputtering apparatus as defined in claim 1, wherein said first auxiliary magnet means through said fifth auxiliary magnet means each comprise a plate magnet.

5. A method of forming or depositing a thin film on a wafer or individual substrates thereon by making use of magnetron sputtering apparatus, said magnetron sputtering apparatus including:

a circular target plate;

magnetic field generating means disposed behind the circular target plate and rotatable around a center axis of rotation and including a center magnet and a ring-shaped magnet arranged around the outer circumference of the center magnet, the center magnet and the ring-shaped magnet having respective opposite poles facing toward said target plate;

a yoke connecting said center magnet and ring-shaped magnet; and means for causing rotation of the magnetic field generating means, wherein the apparatus further includes:

said center magnet being offset laterally toward one side of the center axis of rotation of the magnetic field generating means;

a first auxiliary magnet means having an identical polarity to said center magnet and disposed on the side of said center magnet toward said center axis of rotation;

second auxiliary magnet means having an identical polarity to said ring-shaped magnet and disposed on the outer circumference of said ring-shaped magnet and adjacently to said center magnet on the same side of said center axis of rotation on which said center magnet is located;

two third auxiliary magnet means each having an identical polarity to said ring-shaped magnet and disposed on the inner circumference of said ring-shaped magnet on the opposite lateral ends thereof perpendicularly to the direction in which said center magnet is offset from said center axis of rotation;

fourth auxiliary magnet means having an identical polarity to said ring-shaped magnet and disposed on the inner circumference of said ring-shaped magnet on the side of said center axis of rotation opposite the side on which said first auxiliary magnet means is located; and fifth auxiliary magnet means having an identical polarity with and integrated with the edge of said fourth auxiliary magnet means which is toward said center axis of rotation;

whereby all of said auxiliary magnet means providing a combined magnetic field strength for the center areas on the circular target plate surface, when the magnetic field generating means is rotated;

wherein the method comprises:

rotating said magnetic field generating means while carrying out sputtering from said target for causing an erosion on the circular target plate, having a profile composed of a double concentric circle including an inner circle and an outer circle having peak points of 15/152b to 20/152b and 50/152b to 60/152b, where "b" is the diameter of the circular target plate, respectively, said inner circle and said outer circle having an erosion strength ratio of between 2:3 and 1:1 at each peak point.

6. A method as defined in claim 5, further comprising spacing a wafer which is to have a thin film formed thereon and the circular target plate a distance which is in the range of between 12/61b and 15/61b, where "b" is the diameter of the circular target plate.

* * * * *